US012471214B2

(12) United States Patent
Cheng et al.

(10) Patent No.: US 12,471,214 B2
(45) Date of Patent: Nov. 11, 2025

(54) CIRCUIT BOARD

(71) Applicant: AUO Corporation, Hsinchu (TW)

(72) Inventors: Yun Cheng, Hsinchu (TW); Hao-An Chuang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 188 days.

(21) Appl. No.: 18/499,216

(22) Filed: Nov. 1, 2023

(65) Prior Publication Data

US 2024/0237207 A1 Jul. 11, 2024

(30) Foreign Application Priority Data

Jan. 11, 2023 (TW) ................................. 112101177

(51) Int. Cl.
*H05K 1/11* (2006.01)
(52) U.S. Cl.
CPC ..................................... *H05K 1/111* (2013.01)
(58) Field of Classification Search
CPC ....................................................... H05K 1/111
USPC ......................................................... 174/261
See application file for complete search history.

(56) References Cited

U.S. PATENT DOCUMENTS

| 9,859,239 | B1* | 1/2018 | Hu ....................... H01L 23/3157 |
| 9,865,670 | B2 | 1/2018 | Park et al. |
| 2017/0006704 | A1* | 1/2017 | Yoshioka ................ H01F 5/003 |
| 2017/0040406 | A1 | 2/2017 | Park et al. |
| 2021/0375721 | A1* | 12/2021 | Chen ....................... H01L 24/03 |

FOREIGN PATENT DOCUMENTS

| CN | 201655182 | 11/2010 | |
| CN | 106449695 | 9/2022 | |
| KR | 20210121776 A | * 10/2021 | ............. H01L 23/12 |

* cited by examiner

*Primary Examiner* — Andargie M Aychillhum
(74) *Attorney, Agent, or Firm* — JCIPRNET

(57) ABSTRACT

A circuit board includes a substrate, an insulating structure, a pad structure and a side wire. The substrate has a first surface, a second surface opposite to the first surface, and a side surface. The insulating structure is located above the first surface of the substrate. The pad structure is located in the insulating structure. The insulating structure includes an opening on the pad structure and a removal region between the pad structure and the side surface of the substrate. At least a portion of the insulating structure in the removal region is removed, and the horizontal distance between the removal region and the pad structure is H, 0<H≤10 micrometers. The side wire is filled into the opening of the insulating structure, and extends from the pad structure to the second surface of the substrate.

7 Claims, 12 Drawing Sheets

CIRCUIT BOARD

CROSS-REFERENCE TO RELATED APPLICATION

This application claims the priority benefit of Taiwan application Ser. No. 11/210,1177, filed on Jan. 11, 2023. The entirety of the above-mentioned patent applications is hereby incorporated by reference herein and made a part of this specification.

BACKGROUND

Technical Field

The present invention relates to a circuit board.

Description of Related Art

In the field of display device technology, it is common to deposit multiple layers of insulating material and multiple layers of conductive material on a glass substrate in order to create circuit structures on the glass substrate that include multiple layers of insulating material and multiple layers of conductive material. To meet consumer demands, display devices are typically processed into specific shapes or dimensions. In such cases, it is often necessary to process the side surfaces of the glass substrate. However, when processing the side surfaces of the glass substrate, it often leads to issues such as delamination of the insulating and conductive layers on the glass substrate. Therefore, there is an urgent need for a method to address the aforementioned problems.

SUMMARY

The invention provides a circuit board that can prevent delamination issues with the insulating structures on the substrate.

At least one embodiment of the present invention provides a circuit board. The circuit board includes the circuit structure and a side wire. The circuit structure includes a substrate, an insulating structure and a pad structure. The substrate has a first surface, a second surface opposite to the first surface, and a side surface. An insulating structure is located above the first surface of the substrate. The pad structure is located in the insulating structure. The insulating structure includes an opening on the pad structure and a removal region located between the pad structure and the side surface of the substrate. At least part of the insulating structure in the removal region is removed, and the horizontal distance between the removal region and the pad structure is H, wherein 0<H≤10 micrometers. The side wire is filled in the opening of the insulating structure and extend from the pad structure to the second surface of the substrate.

Based on the above, the insulating structure has the removal region between the pad structure and the side surface of the substrate. Through the arrangement of the removal region, the risk of delamination of the insulating structure can be reduced.

DESCRIPTION OF THE EMBODIMENTS

Figure 1A:
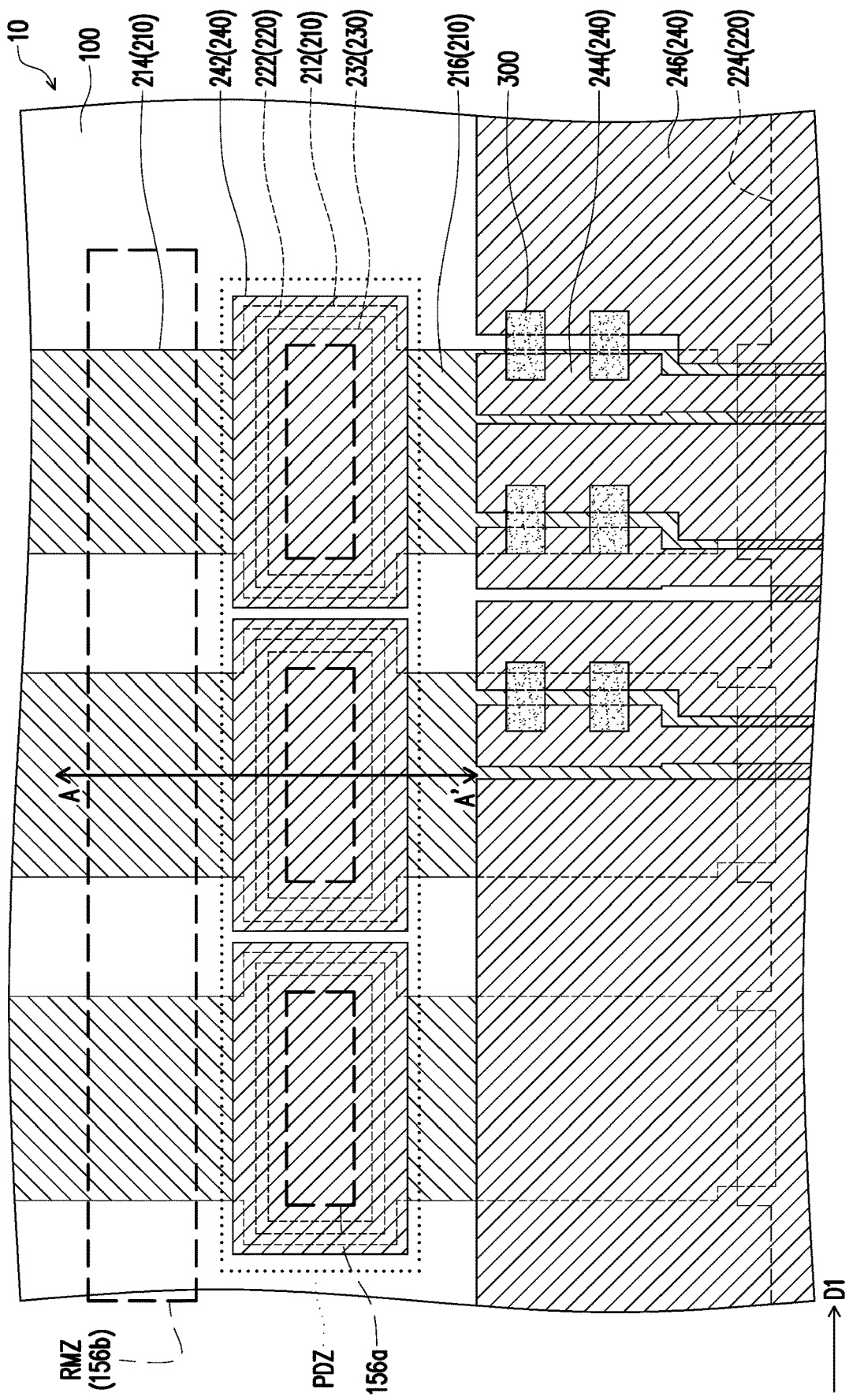
FIG. 1A, FIG. 2A and FIG. 3A are schematic top views of a manufacturing method of a circuit board according to an embodiment of the present invention.
Figure 1B:
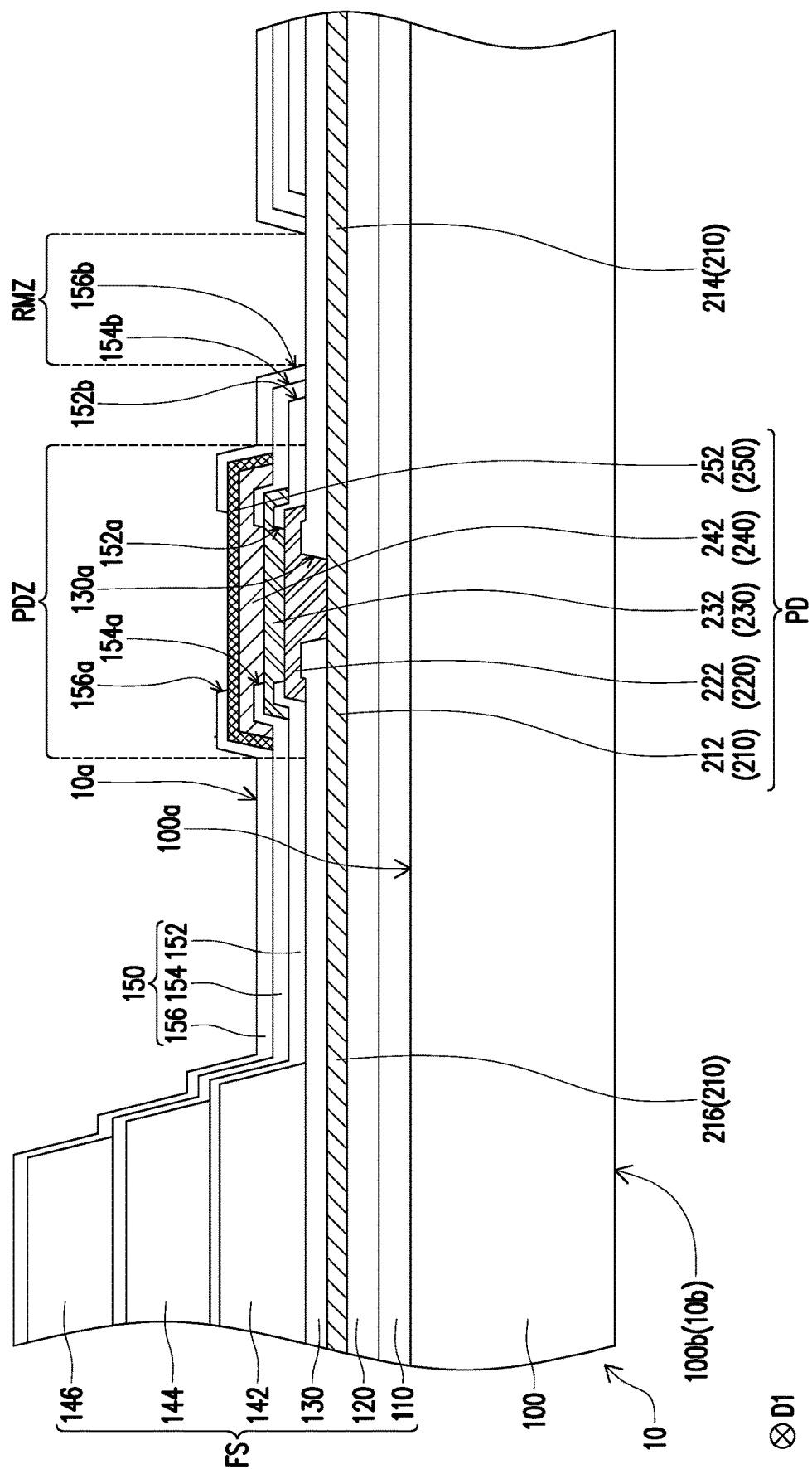
FIG. 1B, FIG. 2B, FIG. 3B and FIG. 4 are schematic cross-sectional views of a manufacturing method of a circuit board according to an embodiment of the present invention.
Figure 2A:
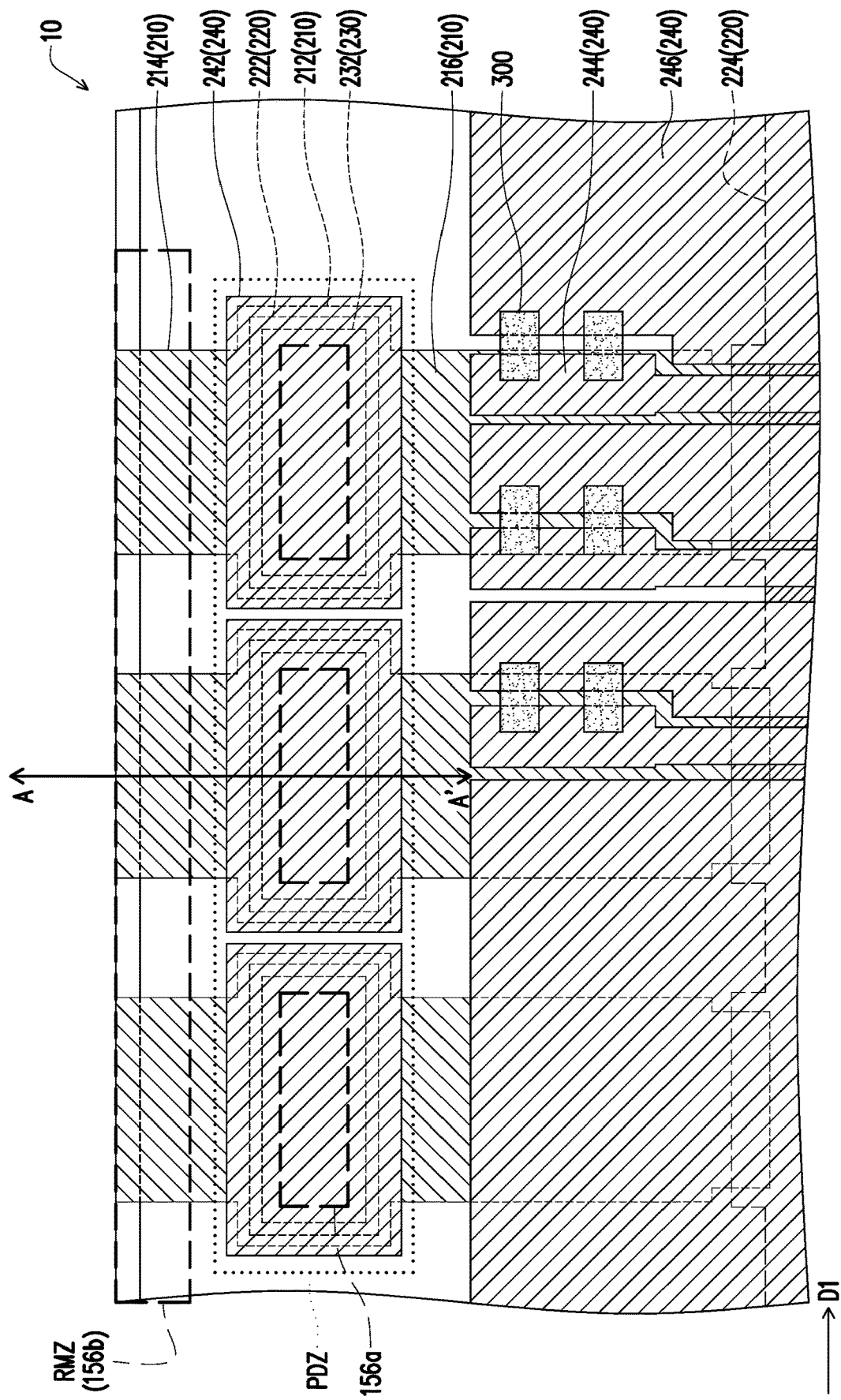
Figure 2B:
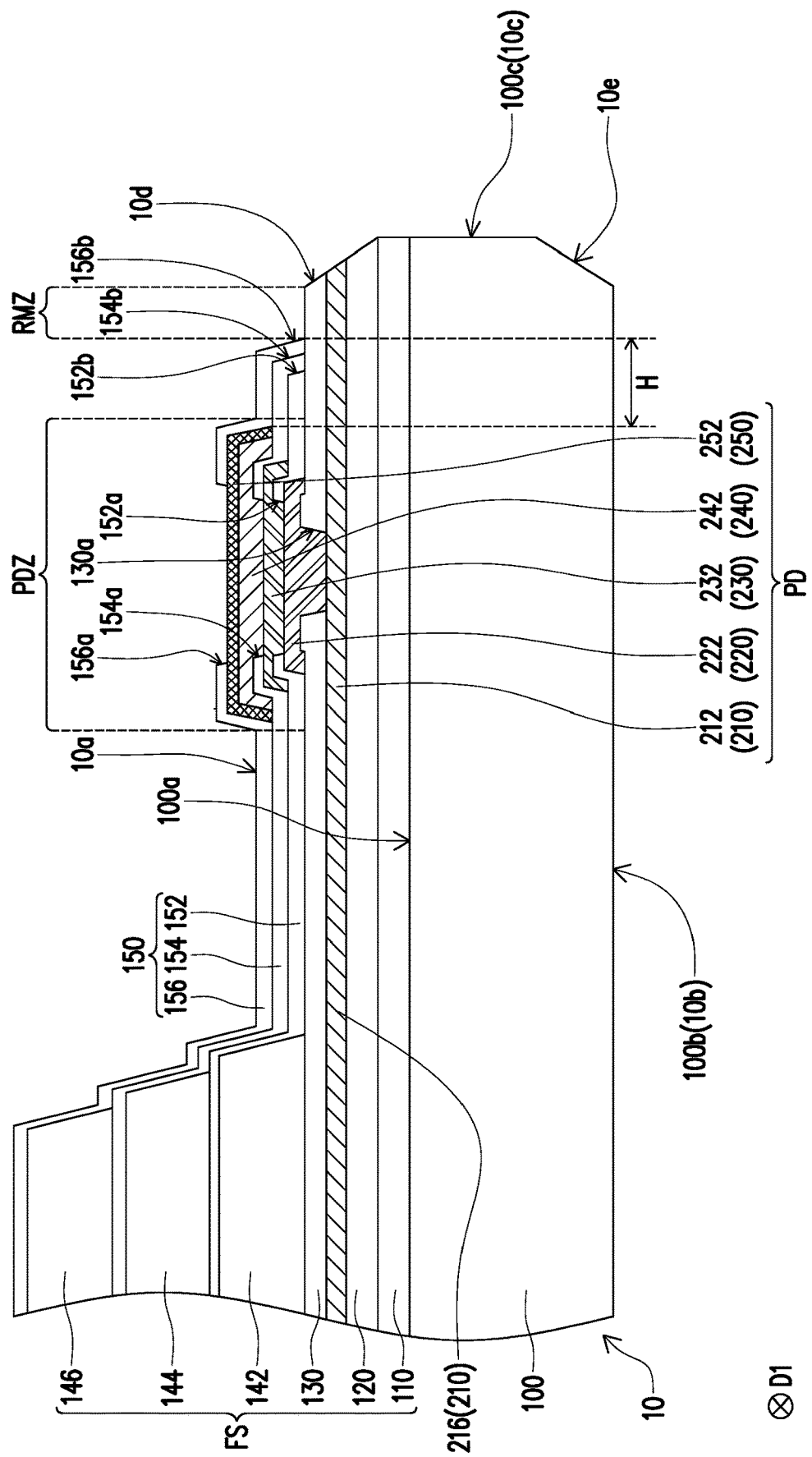
Figure 3A:
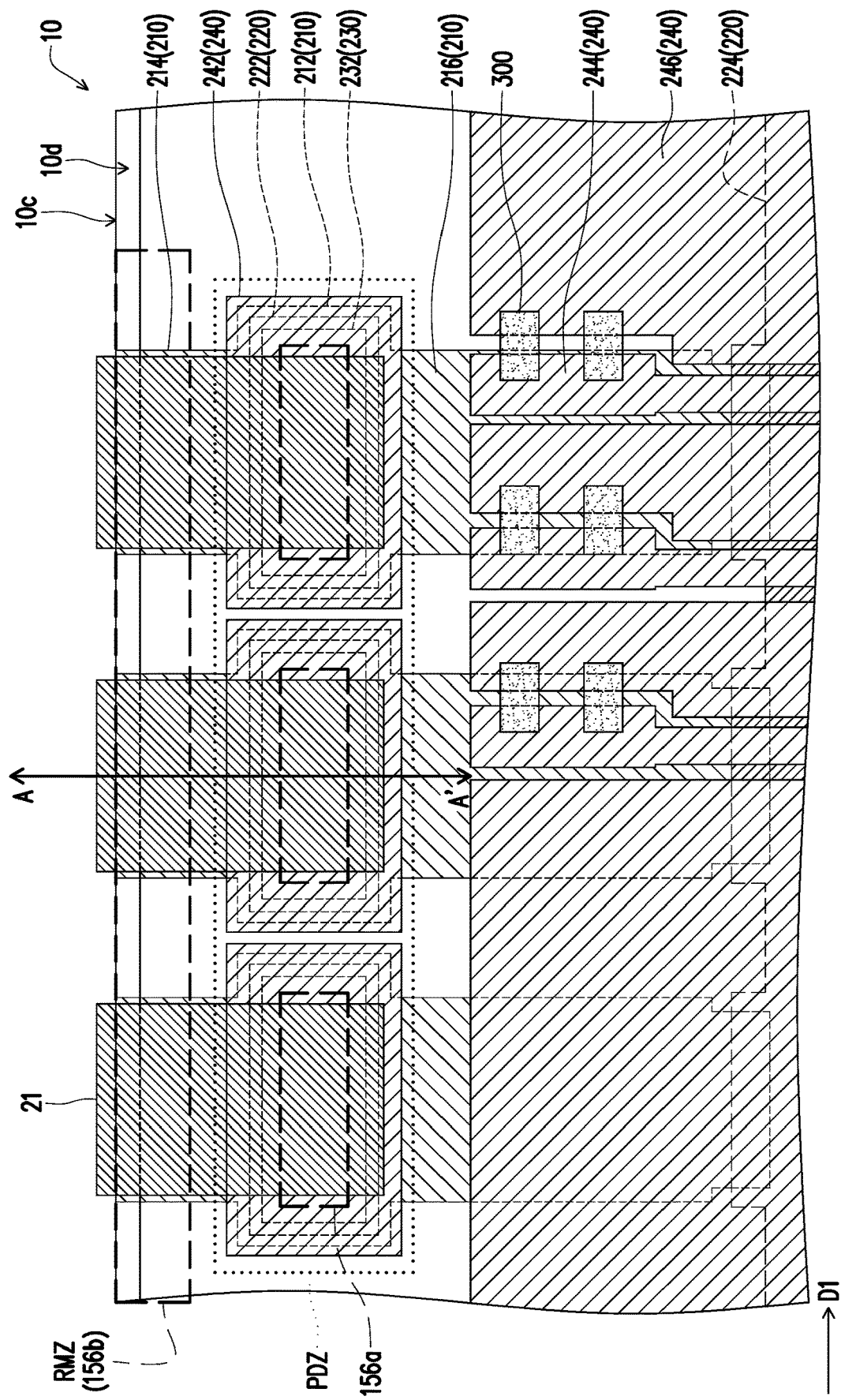

FIG. 1A, FIG. 2A and FIG. 3A are schematic top views of a manufacturing method of a circuit board 1 according to an embodiment of the present invention. FIG. 1B, FIG. 2B, FIG. 3B and FIG. 4 are schematic cross-sectional views of the manufacturing method of the circuit board 1 according to the embodiment of the present invention, wherein FIG. 1B, FIG. 2B and FIG. 3B correspond to the positions of lines A-A' in FIG. 1A, FIG. 2A and FIG. 3A, respectively. For the sake of clarity, partial film layers have been omitted in FIG. 1A, FIG. 2A, and FIG. 3A.

Referring to FIGS. 1A and 1B, a circuit structure 10 is provided, wherein the circuit structure 10 includes a substrate 100 and a front-side structure FS located on the first surface of the substrate 100.

In some embodiments, the substrate 100 is, for example, a rigid substrate, and its material may be glass, quartz, organic polymer or opaque/reflective material (for example: conductive material, metal, wafer, ceramic or other suitable materials) or other suitable materials. However, the invention is not limited thereto. In other embodiments, the substrate 100 may also be a flexible substrate or a stretchable substrate. For example, materials for the flexible substrate and the stretchable substrate include polyimide (PI), polydimethylsiloxane (PDMS), polyethylene terephthalate (PET), polyethylene naphthalate (PEN), polyester (PES), polymethylmethacrylate (PMMA), polycarbonate (PC), polyurethane (PU) or other suitable materials.

In this embodiment, the front-side structure FS on the first surface 100a of the substrate 100 includes a buffer layer 110, a first dielectric layer 120, a second dielectric layer 130, a first planarization layer 142, a second planarization layer 144, a third planarization layer 146, an insulating structure 150, a first conductive layer 210, a second conductive layer 220, a third conductive layer 230, a fourth conductive layer 240 and a fifth conductive layer 250.

The buffer layer 110 is formed blanketly on the first surface 100a of the substrate 100. In some embodiments, the material of the buffer layer 110 includes silicon oxide, silicon nitride, silicon oxynitride, or other suitable materials or combinations of the above materials.

The first dielectric layer 120 is formed on the buffer layer 110. In some embodiments, a semiconductor layer (not shown) is formed on the buffer layer 110 before forming the first dielectric layer 120, and the first dielectric layer 120 covers the semiconductor layer. In some embodiments, the material of the first dielectric layer 120 includes silicon oxide, silicon nitride, silicon oxynitride, or other suitable materials or combinations of the above materials. In some embodiments, the first dielectric layer 120 may be used as a gate dielectric layer.

The first conductive layer 210 is formed over the first dielectric layer 120. The first conductive layer 210 includes a first pad 212, a first test line 214 and a first signal line 216. The first test line 214 is connected to the first pad 212 and extends from the first pad 212 toward the edge of the substrate 100, and the first test line 214 is connected to a test pad (not shown). The first signal line 216 is connected to the first pad 212 and extends from the first pad 212 in a direction away from the edge of the substrate 100. In some embodiments, the first signal line 216 extends toward the display area and is electrically connected to the light-emitting element 300.

The second dielectric layer 130 is formed over the first conductive layer 210 and the first dielectric layer 120. The second dielectric layer 130 includes a first opening 130a, wherein the first opening 130a overlaps the first pad 212. In some embodiments, the second dielectric layer 130 may be used as an interlayer dielectric layer. In some embodiments, the material of the second dielectric layer 130 includes silicon oxide, silicon nitride, silicon oxynitride or other suitable materials or a combination of the above materials.

The second conductive layer 220 is formed above the second dielectric layer 130. The second conductive layer 220 includes a second pad 222. The second pad 222 overlaps the first pad 212 and contact the first pad 212 through the first opening 130a of the second dielectric layer 130.

In this embodiment, the second conductive layer 220 optionally further includes a second signal line 224. In some embodiments, a portion of the first signal lines 216 is electrically connected to the second signal line 224.

An insulating structure 150 and a plurality of planarization layers are formed above the second dielectric layer 130, where the insulating structure 150 can be used to isolate two adjacent planarization layers. For example, in this embodiment, the insulating structure 150 includes a first insulating layer 152, a second insulating layer 154, and a third insulating layer 156, and the first planarization layer 142, the second planarization layer 144, and the third planarization layer 146 are sequentially stacked on the second dielectric layer 130, wherein the first insulating layer 152 extends between the first planarization layer 142 and the second planarization layer 144, the second insulating layer 154 extends between the second planarization layer 144 and the third planarization layer 146, and the third insulating layer 156 is formed above the third planarization layer 146.

The first planarization layer 142 is formed above the second dielectric layer 130, and the first insulating layer 152 extends from the top surface of the first planarization layer 142 to the side surface of the first planarization layer 142 and extends to the top surface of the second dielectric layer 130 along the side surface of the first planarization layer 142. The first insulating layer 152 has a first opening 152a and a first hole 152b, the first opening 152a overlaps the second pad 222, and the first hole 152b is closer to the edge of the substrate 100 than the first opening 152a. In some embodiments, each first opening 152a overlaps a corresponding second pad 222, and the first hole 152b extends along the first direction D1 (the direction perpendicular to the paper surface in FIG. 1B) and overlaps to the corresponding plurality of first test lines 214.

The third conductive layer 230 is formed above the first insulating layer 152. The third conductive layer 230 includes a third pad 232. The third pad 232 overlaps the second pad 222 and contacts the second pad 222 through the first opening 152a of the first insulating layer 152.

The second planarization layer 144 is formed above the first insulating layer 152, and the second insulating layer 154 extends from the top surface of the second planarization layer 144 to the side surface of the second planarization layer 144 and extends along the side surface of the second planarization layer 144 to the top surface of the first insulating layer 152. The second insulation layer 154 is located above the first insulation layer 152. The second insulating layer 154 has a second opening 154a and a second hole 154b, the second opening 154a overlaps the third pad 232, and the second hole 154b is closer to the edge of the substrate 100 than the second opening 154a. In some embodiments, each second opening 154a overlaps a corresponding third pad 232, and the second hole 154b extends along the first direction D1 and overlaps a corresponding plurality of first test lines 214. The second hole 154b of the second insulating layer 154 overlaps the first hole 152b of the first insulating layer 152. In this embodiment, a portion of the second insulating layer 154 extends into the first hole 152b and covers the side wall of the first hole 152b, so that the width of the second hole 154b is smaller than the width of the first hole 152b. However, the invention is not limted thereto. In other embodiments, the second insulating layer 154 does not extend into the first hole 152b, and the width of the second hole 154b is greater than or equal to the width of the first hole 152b.

The fourth conductive layer 240 is formed above the second insulating layer 154. The fourth conductive layer 240 includes a fourth pad 242. The fourth pad 242 overlaps the third pad 232 and contacts the third pad 232 through the second opening 154a of the second insulating layer 154.

In this embodiment, the fourth conductive layer 240 optionally further includes a plurality of first electrodes 244 and a plurality of second electrodes 246. The first electrode 244 and the second electrode 246 are further away from the edge of the substrate 100 than the fourth pad 242.

The fifth conductive layer 250 is formed above the fourth conductive layer 240. The fifth conductive layer 250 includes a fifth pad 252. The fifth pad 252 overlaps the fourth pad 242 and covers the fourth pad 242. The fifth pad 252 can be used as a protective layer to prevent the fourth pad 242 from being oxidized due to exposure to air. In some embodiments, the fifth conductive layer 250 selectively covers the first electrodes 244 and the second electrodes 246.

The third planarization layer 146 is formed above the second insulating layer 154, and the third insulating layer 156 extends from the top surface of the third planarization layer 146 to the side surface of the third planarization layer 146 and extends along the side surface of the third planarization layer 146 to the top surface of the second insulating layer 154. The third insulation layer 156 is located above the second insulation layer 154. The third insulating layer 156 has a third opening 156a and a third hole 156b, the third opening 156a overlaps the fifth pad 252, and the third hole 156b is closer to the edge of the substrate 100 than the third opening 156a. In some embodiments, each third opening 156a overlaps a corresponding fifth pad 252, and the third hole 156b extends along the first direction D1 and overlaps a corresponding plurality of first test lines 214. The third hole 156b of the third insulating layer 156 overlaps the second hole 154b of the second insulating layer 154. In this embodiment, a portion of the third insulating layer 156 extends into the second hole 154b and covers the side wall of the second hole 154b, so that the width of the third hole 156b is smaller than the width of the second hole 154b.

However, the invention is not limited thereto. In other embodiments, the third insulating layer 156 does not extend into the second hole 154b, and the width of the third hole 156b is greater than or equal to the width of the second hole 154b.

In this embodiment, the first pad 212, the second pad 222, the third pad 232, the fourth pad 242 and the fifth pad 252 together form a pad structure PD. In some embodiments, the insulating structure 150 includes one or more pad region PDZ, and the pad structure PD is located in the pad region PDZ of the insulating structure 150. In some embodiments, the plurality of pad structures PD are electrically connected to the corresponding first electrodes 244 and/or the corresponding second electrodes 246, the conductive paths between the pad structures PD and the corresponding first electrodes 244 or the conductive paths between the pad structures PD and the corresponding second electrodes 246 can be adjusted according to actual needs. The insulating structure 150 includes an opening (ie, the third opening 156a) located on the pad structure PD and a removal region RMZ located between the pad structure PD and the side surface of the substrate 100. At least a portion of the insulating structure 150 in the removal region RMZ is removed. For example, in this embodiment, portions of the first insulating layer 152, the second insulating layer 154, and the third insulating layer 156 corresponding to the removal region RMZ are removed through multiple etching processes to form the first hole 152b, the second hole 154b and the third hole 156b in the removal region RMZ. In this embodiment, the insulating structure 150 in the removal region RMZ is completely removed, that is, the first insulating layer 152, the second insulating layer 154 and the third insulating layer 156 in the removal region RMZ are completely removed, but the invention is not limited thereto. In other embodiments, the insulating structure 150 in the removal region RMZ is only partially removed. In some embodiments, the sidewalls of the removal region RMZ are inclined surfaces, but the invention is not limited thereto. In other embodiments, the sidewalls of the removal region RMZ have a stepped structure.

The removal region RMZ extends along the first direction D1 and overlaps the corresponding plurality of first test lines 214. In this embodiment, the second dielectric layer 130 is located above the first surface 100a of the substrate 100, wherein the insulating structure 150 is formed on the second dielectric layer 130. In this embodiment, the second dielectric layer 130 under the removal region RMZ is retained to prevent the first test lines 214 under the removal region RMZ from being exposed.

In this embodiment, the pad structure PD has a five-layer structure, and the insulating structure 150 has a three-layer structure, but the invention is not limited thereto. The number of conductive layers in the pad structure PD and the number of insulating layers in the insulating structure 150 can be adjusted according to actual needs. In other words, the number of conductive layers and the number of insulating layers in the front-side structure FS can be adjusted according to actual needs.

In some embodiments, the materials of the first insulating layer 152, the second insulating layer 154 and the third insulating layer 156 include silicon oxide, silicon nitride, silicon oxynitride or other suitable materials or combinations of the above materials.

In some embodiments, the materials of the first planarization layer 142, the second planarization layer 144 and the third planarization layer 146 include organic materials, such as cured photoresist materials or other suitable materials.

In some embodiments, the materials of the first conductive layer 210, the second conductive layer 220, the third conductive layer 230 and the fourth conductive layer 240 include metals, such as chromium, gold, silver, copper, tin, lead, hafnium, tungsten, molybdenum, neodymium, titanium, tantalum, aluminum, zinc, nickel and other metals or combinations of the above or other conductive materials. In some embodiments, the material of the fifth conductive layer 250 includes a conductive oxide, such as indium tin oxide or other conductive materials.

The light-emitting element 300 is located above the first surface 100a of the substrate 100 and is electrically connected to the corresponding first electrode 244 and the corresponding second electrode 246. In this embodiment, the light-emitting element 300 is a mini light-emitting diode or a micro light-emitting diode, but the invention is not limited thereto. In other embodiments, the light-emitting element 300 is an organic light-emitting diode or other types of light-emitting diodes.

In this embodiment, the testing procedure is carried out through the first test line 214 and a testing pad (not shown) to test whether the light-emitting element 300 is functioning normally. For example, by making contact with the testing pad using a probe, power is supplied to the light-emitting element 300, and it is examined whether the light-emitting element 300 lights up. In some embodiments, multiple first test lines 214 are connected to the same testing pad.

Referring to FIGS. 2A and 2B, after the testing procedure is completed, a portion of the circuit structure 10 is removed through a cutting process. For example, the portion of the circuit structure 10 corresponding to the first test line 214 and the testing pad is removed, thereby reducing the size of the device. In some embodiments, the edge of the circuit structure 10 is optionally processed through a grinding process. The side surface 10c of the ground circuit structure 10 includes the side surface 100c of the substrate 100, and the backside 10b of the circuit structure 10 includes the second side 100b of the substrate 100. A first inclined surface 10d or a first rounded corner (not shown) is included between the front side 10a and the side surface 10c of the circuit structure 10, and a second inclined surface 10e or a second rounded corner (not shown) is included between the back side 10b and the side surface 10c of the circuit structure 10. In this embodiment, for example, the ground circuit structure 10 includes a first inclined surface 10d and a second inclined surface 10e.

In this embodiment, due to the pre-formation of a removal region RMZ within the insulating structure 150 before the cutting process is performed, it is possible to reduce damage to the insulating structure 150 caused by the cutting process and avoid delamination issues of the insulating structure 150 during the cutting process. In some embodiments, to prevent damage to the pad structure PD caused by the cutting process, the horizontal distance H between the removal region RMZ and the pad structure PD must be greater than 0. To avoid exposing the sidewalls of the pad structure PD and to prevent the subsequent formation of side wires 21 (refer to FIG. 3A and FIG. 3B) from having an excessively long length on the front side 10a of the circuit structure 10, making it susceptible to disconnection, H must be less than or equal to 10 micrometers. In other words, $0 < H \leq 10$ micrometers.

After the cutting process is performed, the removal region RMZ of the insulating structure 150 is a hole facing the side surface 10c of the circuit structure 10. In this embodiment, the third opening 156a of the third insulating layer 156 exposing the pad structure PD is separated from the aforementioned hole.

Figure 3B:
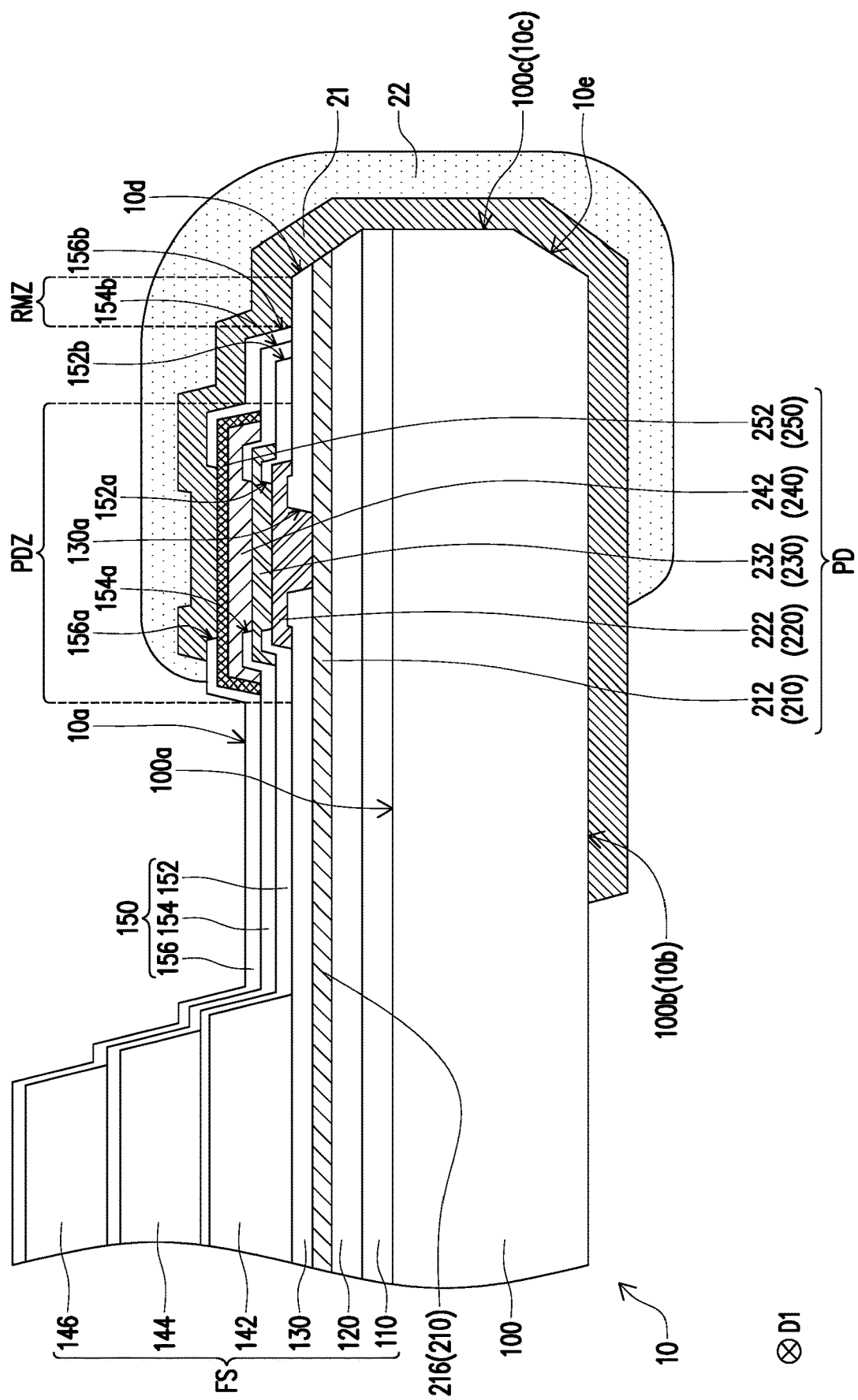

Referring to FIG. 3A and FIG. 3B, a side wire 21 is formed on the side surface 10c of the circuit structure 10. In this embodiment, the side wire 21 extends from the front surface 10a of the circuit structure 10 to the back side 10b of the circuit structure 10 along the first inclined surface 10d (or the first rounded corner), the side surface 10c, and the second inclined surface 10e (or the second rounded corner). The side wire 21 is filled in the third opening 156a of the insulating structure 150 and contact the pad structure PD. The side wire 21 extends from the pad structure PD to the second surface 100b of the substrate 100. In this embodiment, the side wire 21 is also filled into the removal region RMZ of the insulating structure 150 and contact the sidewalls of the removal region RMZ and the second dielectric layer 130 below the removal region RMZ.

In this embodiment, after the cutting process is performed, in the removal region RMZ, the width of the third hole 156b is smaller than the width of the second hole 154b, and the width of the second hole 154b is smaller than the width of the first hole 152b, but the invention is not limited thereto. In other embodiments, after the cutting process is performed, in the removal region RMZ, the width of the third hole 156b is greater than or equal to the width of the second hole 154b, and the width of the second hole 154b is greater than or equal to the first hole 152b width.

In some embodiments, the material of the side wires 21 includes copper, aluminum, titanium, conductive glue (such as silver glue) or other suitable materials.

A black covering layer 22 is formed on the side wire 21. The black covering layer 22 is used to prevent the side wire 21 from being damaged due to collision. In some embodiments, the black covering layer 22 includes an insulating material.

Figure 4:
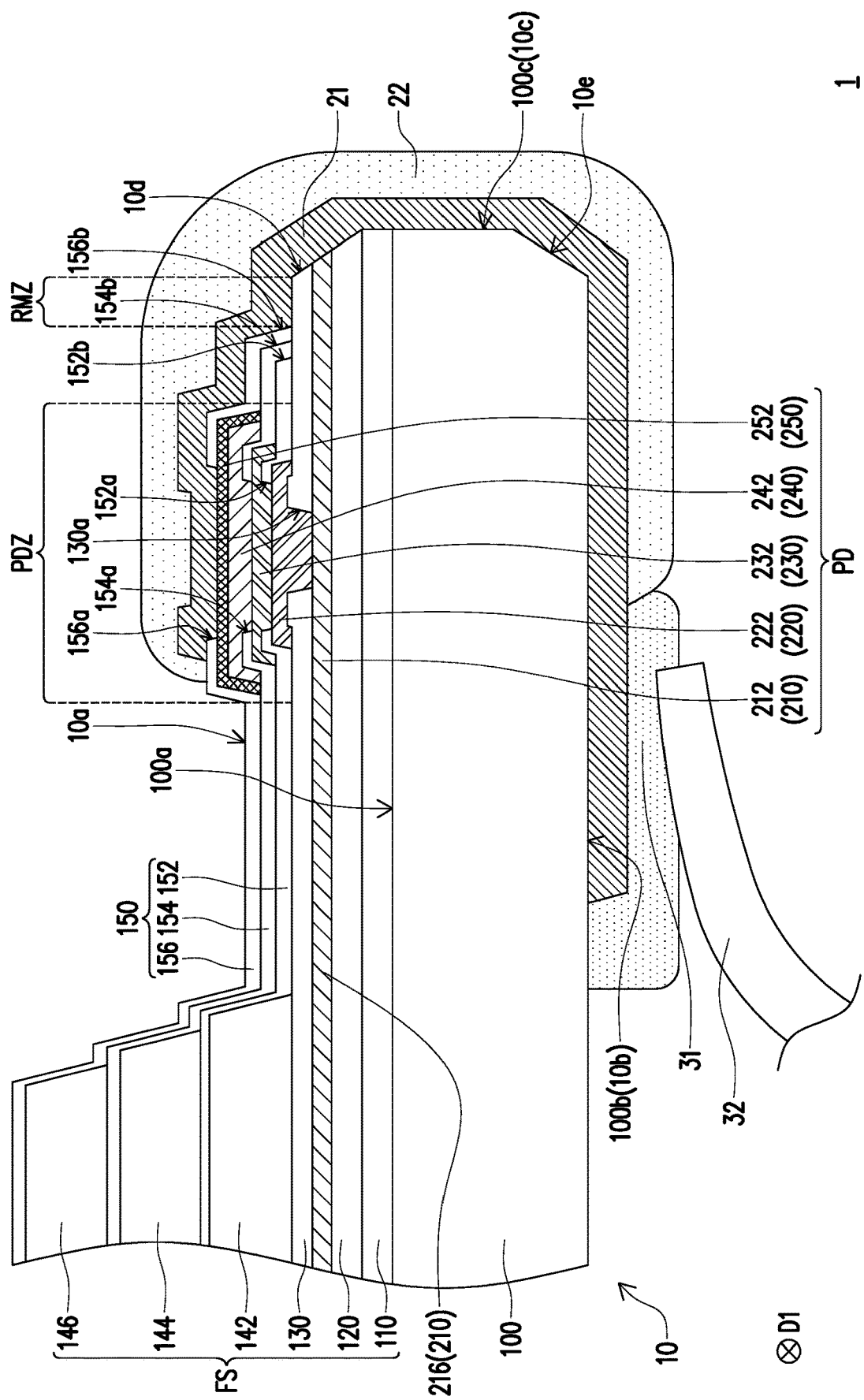

Referring to FIG. 4, the flexible circuit board 32 is electrically connected to the side wire 21. For example, the flexible circuit board 32 is electrically connected to the side wire 21 through the conductive connecting material 31. The conductive connecting material 31 is, for example, solder, conductive glue or other suitable materials.

In this embodiment, the portion of the side wire 21 extending to the second surface 100b of the substrate 100 can be used as a lead, so the flexible circuit board 32 can be bonded to the side wire 21.

Figure 5:
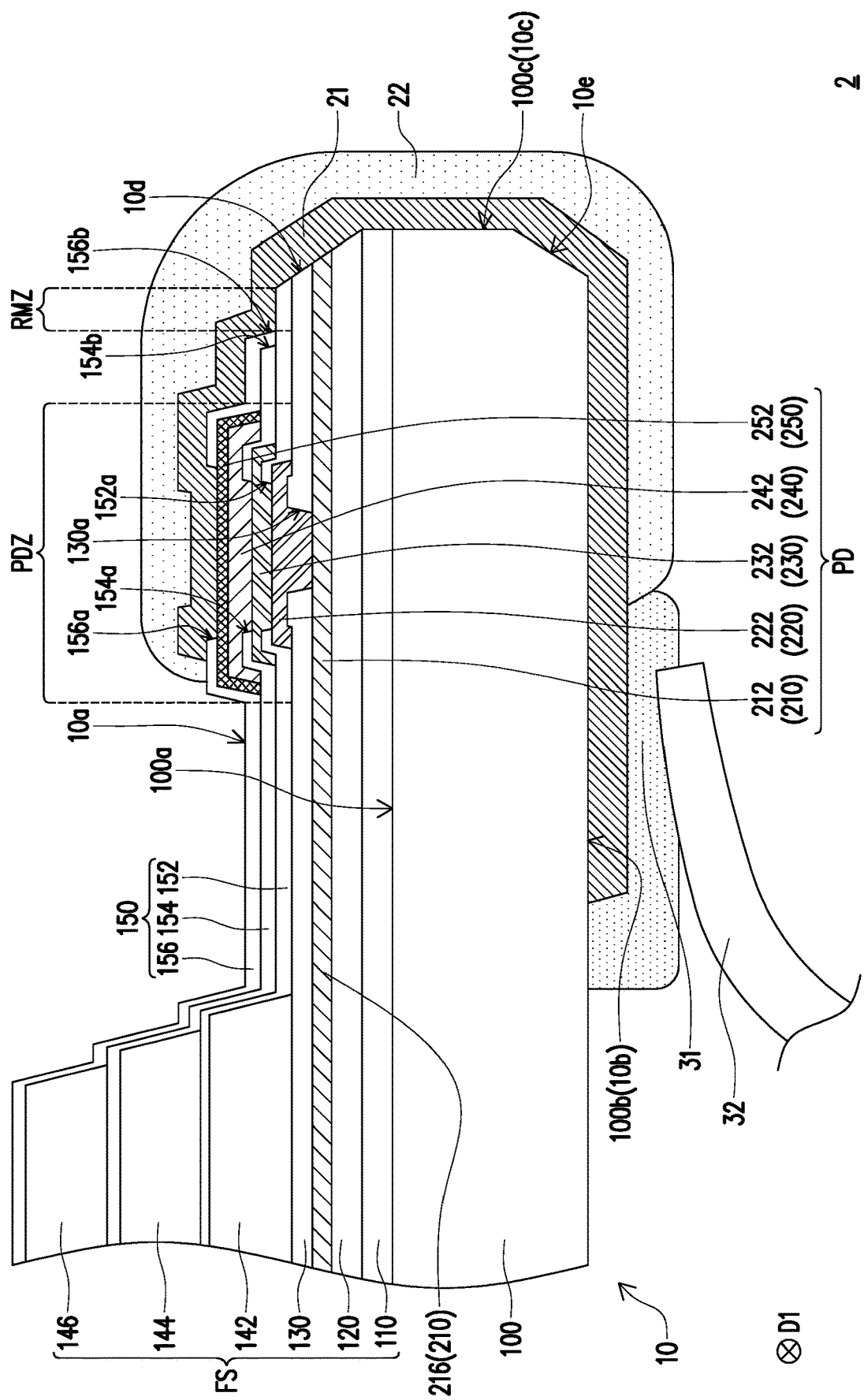
FIG. 5 is a schematic cross-sectional view of a circuit board according to an embodiment of the present invention.

FIG. 5 is a schematic cross-sectional view of a circuit board 2 according to an embodiment of the present invention. It should be noted herein that, in embodiments provided in FIG. 5, element numerals and partial content of the embodiments provided in FIG. 1A to FIG. 4 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 5, in this embodiment, the second insulating layer 154 and the third insulating layer 156 in the removal region RMZ are completely removed. However, the first insulating layer 152 located on the bottom surface of the removal region RMZ is not completely removed (it can also be said that it is not removed before the cutting process). In this embodiment, the side wire 21 contacts the sidewalls of the removal region RMZ and the first insulating layer 152 located on the bottom surface of the removal region RMZ.

Through the design of the removal region RMZ, it is possible to reduce the thickness of the insulating structure 150 in the portion near the side surface 10c of the circuit structure 10, thereby improving the delamination issues of the insulating structure 150 during the cutting process.

Figure 6:
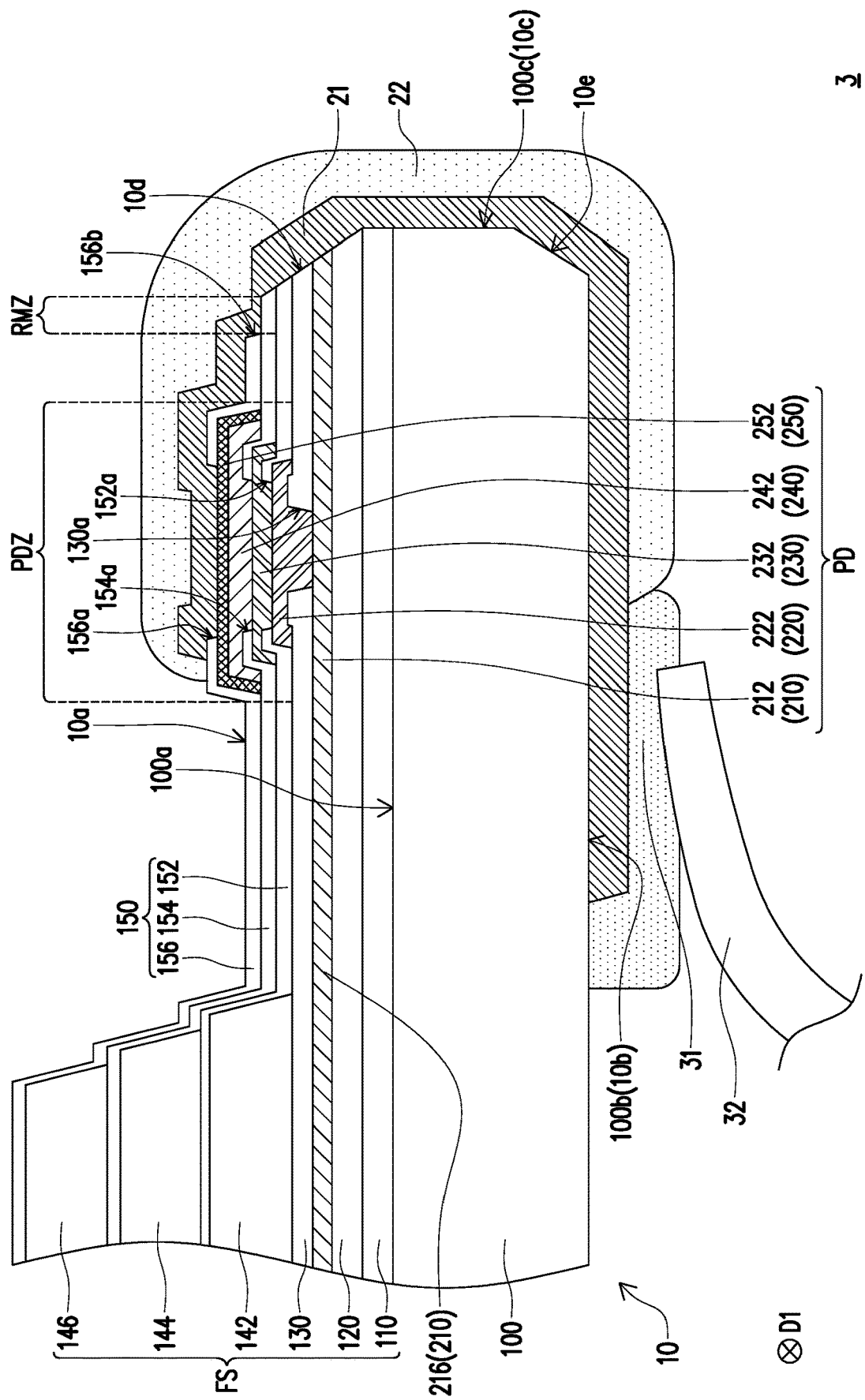
FIG. 6 is a schematic cross-sectional view of a circuit board according to an embodiment of the present invention.

FIG. 6 is a schematic cross-sectional view of a circuit board 3 according to an embodiment of the present invention. It should be noted herein that, in embodiments provided in FIG. 6, element numerals and partial content of the embodiments provided in FIG. 1A to FIG. 4 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 6, in this embodiment, the third insulating layer 156 in the removal region RMZ is completely removed. However, the first insulating layer 152 and the second insulating layer 154 located on the bottom surface of the removal region RMZ are not completely removed (it can also be said that they are not removed before the cutting process). In this embodiment, the side wire 21 contacts the sidewalls of the removal region RMZ and the second insulating layer 154 located on the bottom surface of the removal region RMZ.

Through the design of the removal region RMZ, it is possible to reduce the thickness of the insulating structure 150 in the portion near the side surface 10c of the circuit structure 10, thereby improving the delamination issues of the insulating structure 150 during the cutting process.

Figure 7:
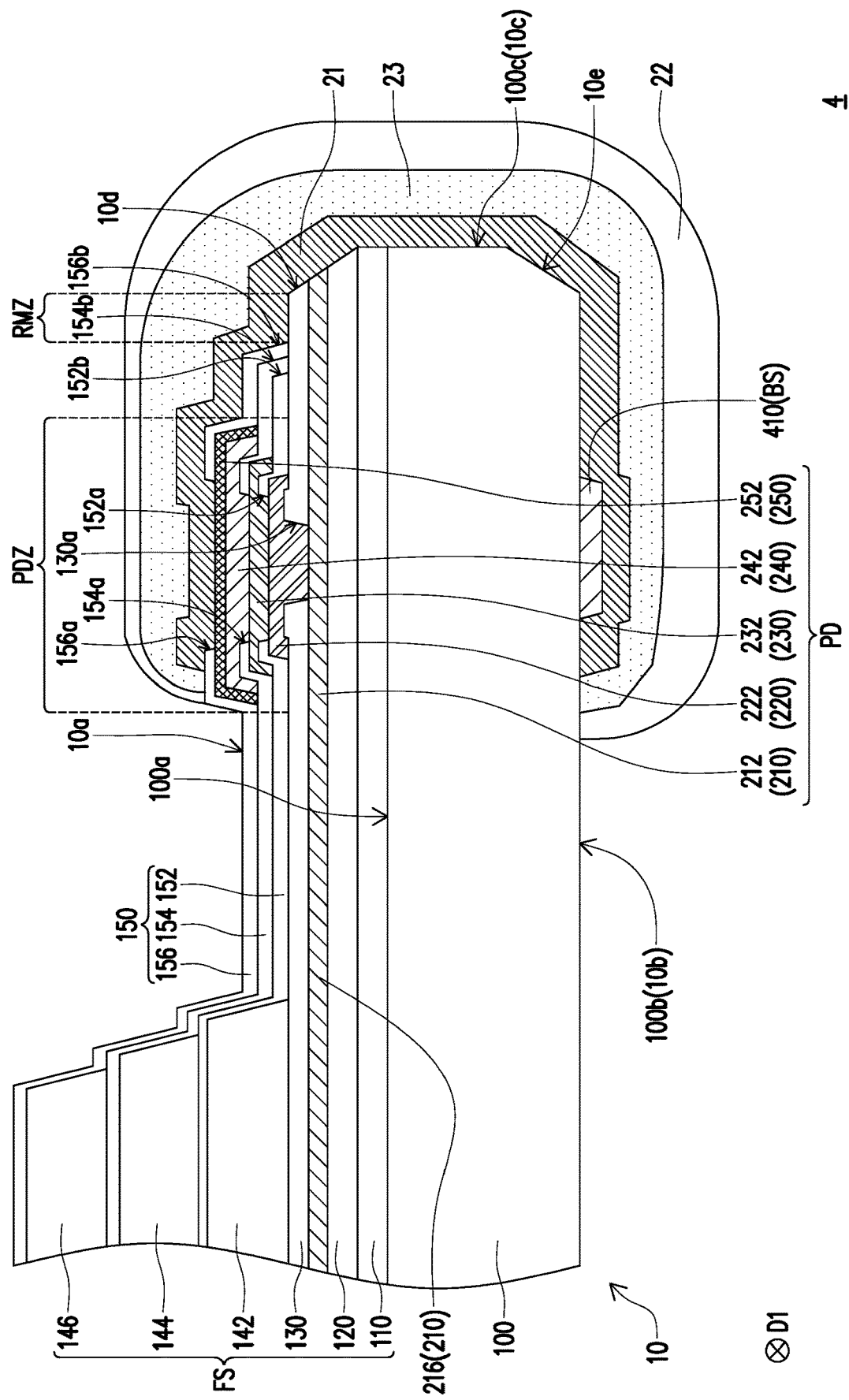
FIG. 7 is a schematic cross-sectional view of a circuit board according to an embodiment of the present invention.

FIG. 7 is a schematic cross-sectional view of a circuit board 4 according to an embodiment of the present invention. It should be noted herein that, in embodiments provided in FIG. 7, element numerals and partial content of the embodiments provided in FIG. 1A to FIG. 4 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 7, in this embodiment, the circuit structure 10 includes a substrate 100, a front-side structure FS located above the first side of the substrate 100, and a backside structure BS located on the second side of the substrate 100. The backside structure BS includes a pad 410 and backside wire (not shown).

The side wire 21 electrically connect the pad structure PD to the pad 410. In some embodiments, the pad 410 is electrically connected to backside wire, wherein the backside wire may optionally include a lead, and a flexible circuit board (not shown) is bonded to the aforementioned lead.

In this embodiment, a protective layer 23 is optionally included between the black covering layer 22 and the side wire 21. In some embodiments, the protective layer 23 can be formed through a printing process, and the protective layer 23 is an etching resist layer.

Figure 8:
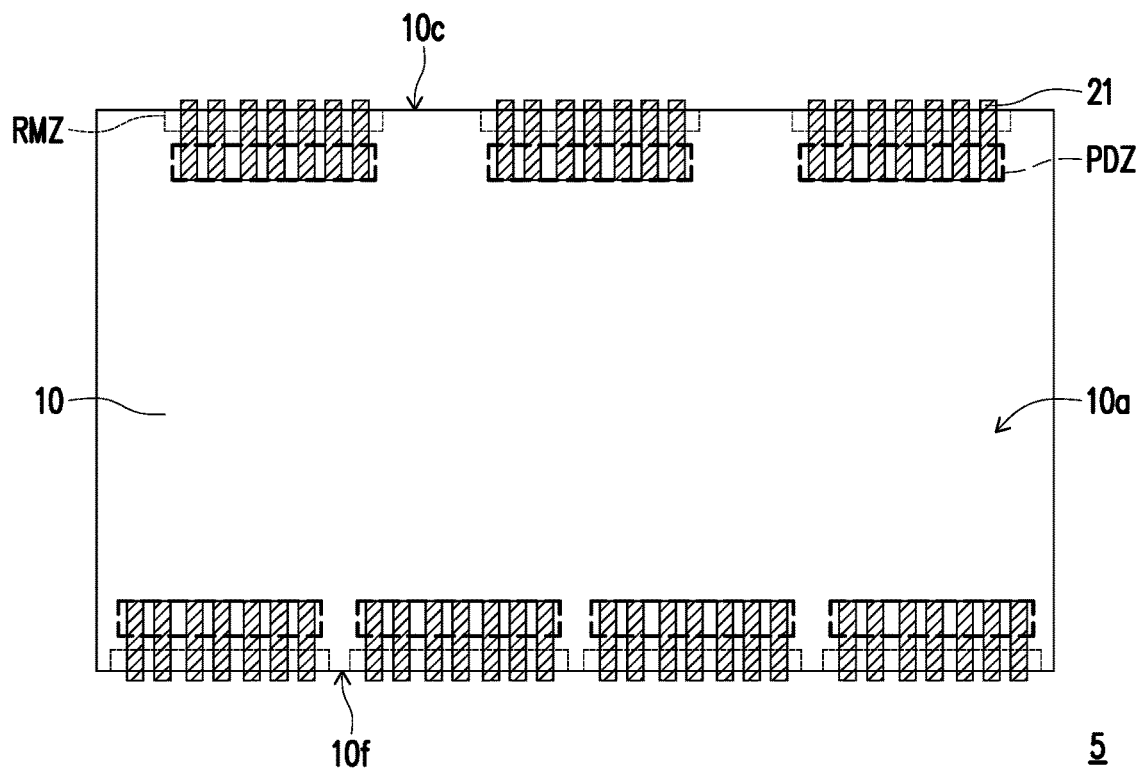
FIG. 8 is a schematic top view of a circuit board according to an embodiment of the present invention.

FIG. 8 is a schematic top view of a circuit board 5 according to an embodiment of the present invention. For clarity, FIG. 8 illustrates the side wire 21, the pad regions PDZ, and the removal regions RMZ while omitting the depiction of other structures. The omitted structures can be referred to in any of the embodiments shown in FIGS. 1A to 7, and will not be further elaborated upon here.

Referring to FIG. 8, in this embodiment, the circuit structure 10 includes two opposite side surfaces 10c and 10f, and the side wires 21 are provided on the side surfaces 10c and 10f. In this embodiment, a plurality of removal regions RMZ are arranged along the side surface 10c, and a plurality of removal regions RMZ are arranged along the side surface 10f. In this embodiment, each removal region RMZ is disposed corresponding to one pad region PDZ.

Figure 9:
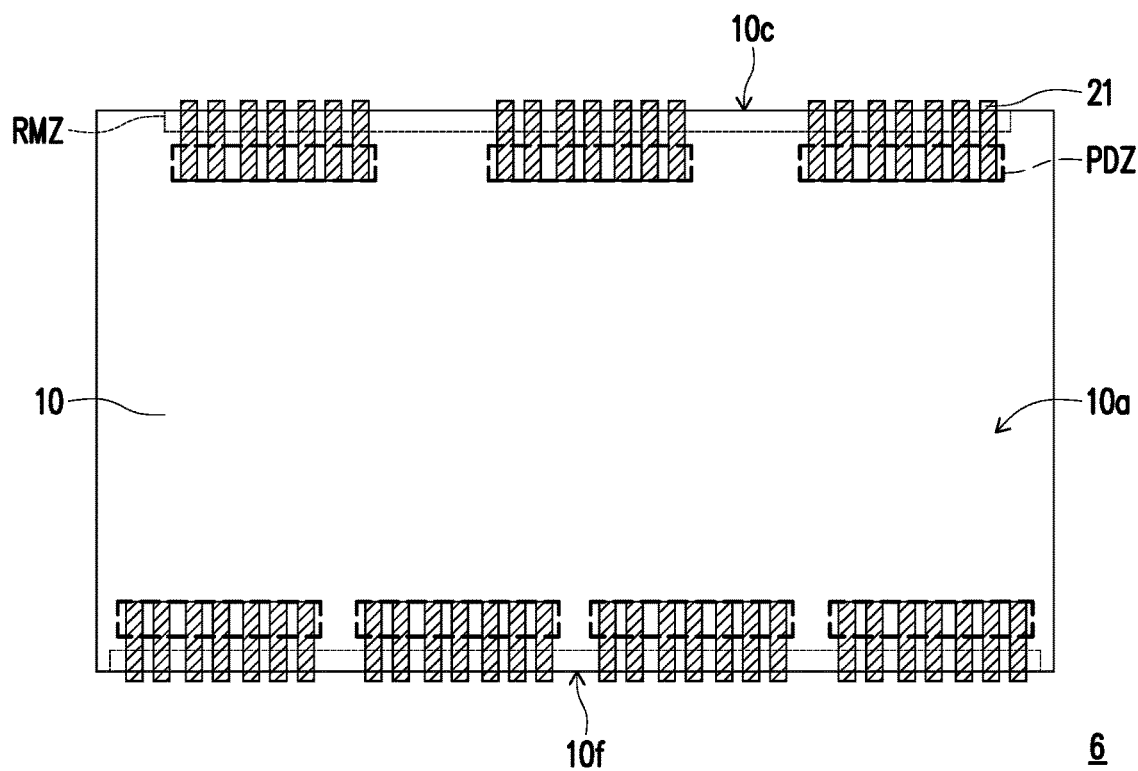
FIG. 9 is a schematic top view of a circuit board according to an embodiment of the present invention.

FIG. 9 is a schematic top view of a circuit board 6 according to an embodiment of the present invention. For clarity, FIG. 9 illustrates the side wire 21, the pad regions PDZ, and the removal regions RMZ while omitting the depiction of other structures. The omitted structures can be referred to in any of the embodiments shown in FIGS. 1A to 7, and will not be further elaborated upon here.

Referring to FIG. 9, in this embodiment, the circuit structure 10 includes two opposite side surfaces 10c and 10f, and the side wires 21 are provided on the side surfaces 10c and 10f. In this embodiment, one removal region RMZ is provided along the side surface 10c, and one removal region RMZ is provided along the side surface 10f. In this embodiment, each removal region RMZ is disposed corresponding to a plurality of pad areas PDZ.

Figure 10:
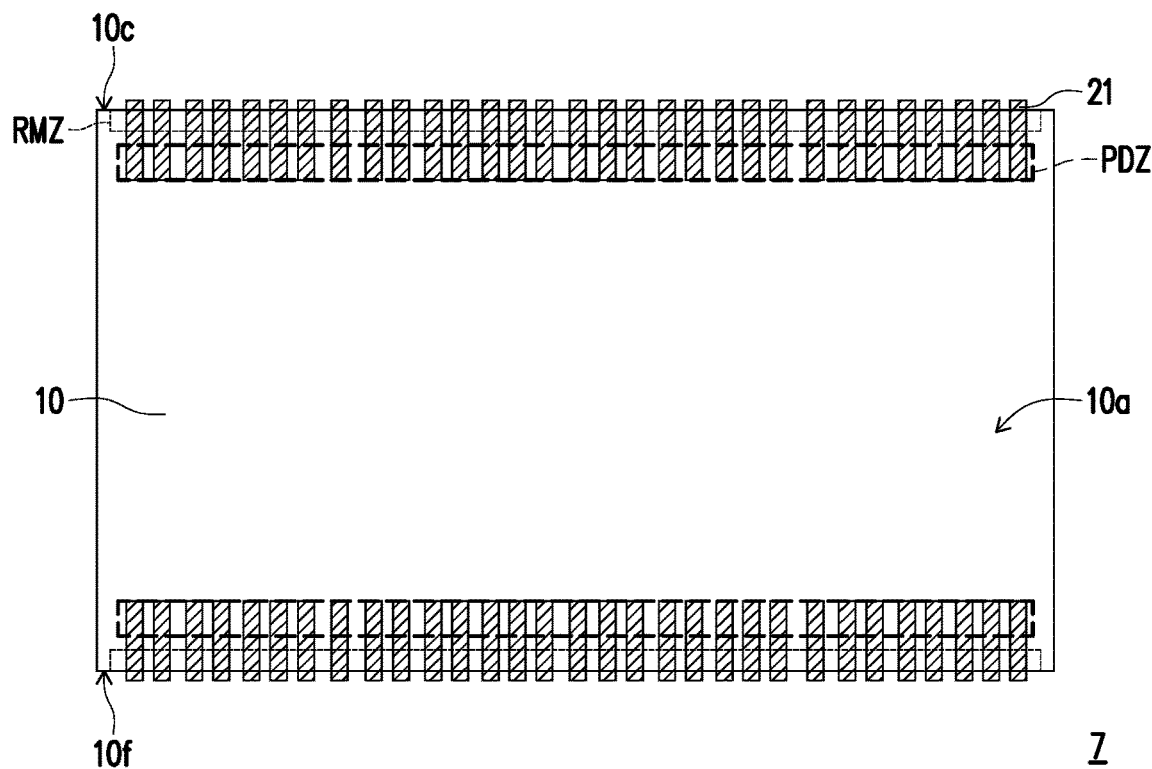
FIG. 10 is a schematic top view of a circuit board according to an embodiment of the present invention.

FIG. 10 is a schematic top view of a circuit board 7 according to an embodiment of the present invention. For clarity, FIG. 10 illustrates the side wire 21, the pad regions PDZ, and the removal regions RMZ while omitting the depiction of other structures. The omitted structures can be referred to in any of the embodiments shown in FIGS. 1A to 7, and will not be further elaborated upon here.

Referring to FIG. 10, in this embodiment, the circuit structure 10 includes two opposite side surfaces 10c and 10f, and the side wires 21 are provided on the side surfaces 10c and 10f. In this embodiment, one removal region RMZ is provided along the side surface 10c, and one removal region RMZ is provided along the side surface 10f. In this embodiment, each removal region RMZ is disposed corresponding to one pad area PDZ.

Figure 11:
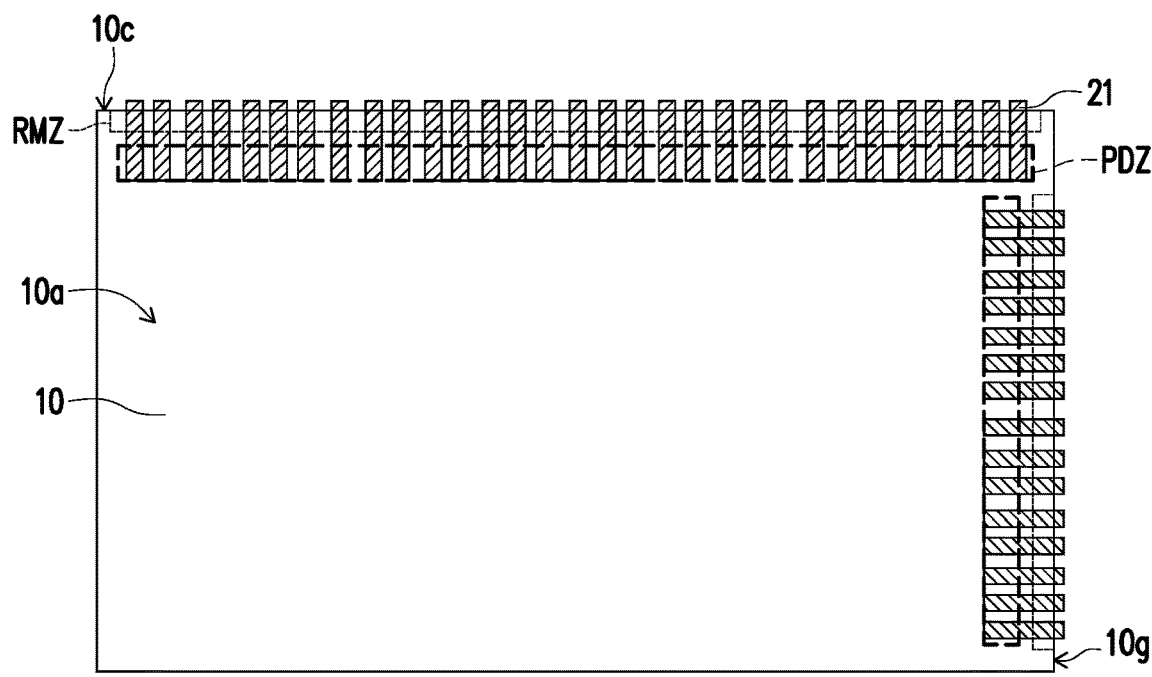
FIG. 11 is a schematic top view of a circuit board according to an embodiment of the present invention.

FIG. 11 is a schematic top view of a circuit board 8 according to an embodiment of the present invention. For clarity, FIG. 11 illustrates the side wire 21, the pad regions PDZ, and the removal regions RMZ while omitting the depiction of other structures. The omitted structures can be referred to in any of the embodiments shown in FIGS. 1A to 7, and will not be further elaborated upon here.

Referring to FIG. 11, in this embodiment, the circuit structure 10 includes two adjacent side surfaces 10c and 10g, and the side wires 21 are arranged on the side surfaces 10c and 10g. In this embodiment, one removal region RMZ is provided along the side surface 10c, and one removal region RMZ is provided along the side surface 10g. In this embodiment, each removal region RMZ is disposed corresponding to one pad area PDZ.

In summary, in the circuit board of the present invention, the insulating structure located on the first surface of the substrate includes a removal region. The removal region is situated between the pad structure and the side surface of the substrate, and it can reduce the risk of delamination of the insulating structure.

What is claimed is:

1. A circuit board, comprising:
   a circuit structure, comprising:
      a substrate having a first side, a second side opposite to the first side, and a side surface;
      an insulating structure, disposed above the first side of the substrate, wherein the insulating structure comprises a first insulating layer, a second insulating layer and a third insulating layer, the second insulating layer is located above the first insulating layer, and the third insulating layer is located above the second insulating layer; and
      a pad structure, located in the insulating structure, wherein the insulating structure comprises an opening located on the pad structure and a removal region located between the pad structure and the side surface of the substrate, wherein at least a portion of the insulating structure in the removal region is removed, a horizontal distance between the removal region and the pad structure is H, 0<H≤10 micrometers, the second insulating layer and the third insulating layer in the removal region are completely removed, and the side wire is in contact with a sidewall of the removal region and the first insulation layer located at a bottom surface of the removal region; and
   a first planarization layer, a second planarization layer and a third planarization layer stacked in sequence, wherein the first insulating layer extends between the first planarization layer and the second planarization layer, the second insulating layer extends between the second planarization layer and the third planarization layer, and the third insulating layer is formed above the third planarization layer; and
   a side wire, filled in the opening of the insulating structure and extending from the pad structure to the second side of the substrate.

2. The circuit board of claim 1, further comprises:
   a dielectric layer, located above the first side of the substrate, wherein the insulating structure is formed on the dielectric layer, and the side wire is in contacts with a sidewall of the removal region and the dielectric layer below the removal region.

3. The circuit board of claim 1, wherein the insulating structure comprises at least one of following materials: silicon oxide, silicon nitride and silicon oxynitride.

4. The circuit board of claim 1, wherein a first inclined surface or a first rounded corner is included between a front-side of the circuit structure and a side surface of the circuit structure, and a second inclined surface or a second rounded corner is included between a backside of the circuit structure and the side surface of the circuit structure, wherein the side surface of the circuit structure comprises the side surface of the substrate.

5. The circuit board of claim 1, wherein the removal region of the insulating structure is a hole facing toward a side surface of the circuit structure, and the side wire is filled in the opening and the hole of the insulating structure.

6. The circuit board of claim 5, wherein the opening is separated from the hole.

7. A circuit board, comprising:
   a circuit structure, comprising:
      a substrate having a first side, a second side opposite to the first side, and a side surface;
      an insulating structure, disposed above the first side of the substrate, wherein the insulating structure comprises a first insulating layer, a second insulating layer, and a third insulating layer, the second insulating layer is located above the first insulating layer, and the third insulating layer is located above the second insulating layer; and
      a pad structure, located in the insulating structure, wherein the insulating structure comprises an opening located on the pad structure and a removal region located between the pad structure and the side surface of the substrate, at least a portion of the insulating structure in the removal region is removed, a horizontal distance between the removal region and the pad structure is H, 0<H≤10 micrometers, the first insulating layer, the second insulating layer and the third insulating layer in the removal region are completely removed, and a sidewall of the removal region is an inclined surface; and a side wire, filled in the opening of the insulating structure and extending from the pad structure to the second side of the substrate, wherein the first insulating layer has a first hole located in the removal region, the second insulating layer has a second hole located in the removal region, and the third insulating layer has a third hole located in the removal region, wherein a width of the third hole is smaller than a width of the second hole, and a width of the second hole is smaller than a width of the first hole.

* * * * *